(12) United States Patent
Thompson et al.

(10) Patent No.: US 9,838,012 B2
(45) Date of Patent: Dec. 5, 2017

(54) DIGITAL CIRCUITS HAVING IMPROVED TRANSISTORS, AND METHODS THEREFOR

(71) Applicant: Mie Fujitsu Semiconductor Limited, Kuwana, Mie (JP)

(72) Inventors: Scott E. Thompson, Gainesville, FL (US); Lawrence T. Clark, Phoenix, AZ (US)

(73) Assignee: Mie Fujitsu Semiconductor Limited, Kuwana (JP)

( * ) Notice: Subject to any disclaimer, the term of this patent is extended or adjusted under 35 U.S.C. 154(b) by 0 days.

(21) Appl. No.: 15/480,550

(22) Filed: Apr. 6, 2017

(65) Prior Publication Data

US 2017/0214404 A1    Jul. 27, 2017

Related U.S. Application Data

(60) Division of application No. 14/867,506, filed on Sep. 28, 2015, now Pat. No. 9,680,470, which is a division
(Continued)

(51) Int. Cl.
| | | |
|---|---|---|
| H01L 25/00 | (2006.01) | |
| H03K 19/00 | (2006.01) | |
| H01L 29/10 | (2006.01) | |
| H01L 27/118 | (2006.01) | |
| G11C 11/412 | (2006.01) | |

(52) U.S. Cl.
CPC ........ *H03K 19/0013* (2013.01); *G11C 11/412* (2013.01); *H01L 27/11807* (2013.01); *H01L 29/1095* (2013.01)

(58) Field of Classification Search
None
See application file for complete search history.

(56) References Cited

U.S. PATENT DOCUMENTS 3,958,266 A    5/1976  Athanas
4,000,504 A   12/1976  Berger
(Continued)

FOREIGN PATENT DOCUMENTS

EP    0274278    7/1988
EP    0312237    4/1989
(Continued)

OTHER PUBLICATIONS

Banerjee, et al. "Compensating Non-Optical Effects using Electrically-Driven Optical Proximity Correction", Proc. of SPIE vol. 7275 72750E, 2009.
(Continued)

*Primary Examiner* — Anh Tran
(74) *Attorney, Agent, or Firm* — Baker Botts L.L.P.

(57) ABSTRACT

Digital circuits are disclosed that may include multiple transistors having controllable current paths coupled between first and second logic nodes. One or more of the transistors may have a deeply depleted channel formed below its gate that includes a substantially undoped channel region formed over a relatively highly doped screen layer formed over a doped body region. Resulting reductions in threshold voltage variation may improve digital circuit performance. Logic circuit, static random access memory (SRAM) cell, and passgate embodiments are disclosed.

6 Claims, 10 Drawing Sheets

Related U.S. Application Data of application No. 13/891,929, filed on May 10, 2013, now Pat. No. 9,184,750, which is a continuation of application No. 13/030,939, filed on Feb. 18, 2011, now Pat. No. 8,461,875.

(56) References Cited

U.S. PATENT DOCUMENTS

| | | |
|---|---|---|
| 4,021,835 A | 5/1977 | Etoh et al. |
| 4,242,691 A | 12/1980 | Kotani et al. |
| 4,276,095 A | 6/1981 | Beilstein, Jr. et al. |
| 4,315,781 A | 2/1982 | Henderson |
| 4,518,926 A | 5/1985 | Swanson |
| 4,559,091 A | 12/1985 | Allen et al. |
| 4,578,128 A | 3/1986 | Mundt et al. |
| 4,617,066 A | 10/1986 | Vasudev |
| 4,662,061 A | 5/1987 | Malhi |
| 4,761,384 A | 8/1988 | Neppl et al. |
| 4,780,748 A | 10/1988 | Cunningham et al. |
| 4,819,043 A | 4/1989 | Yazawa et al. |
| 4,885,477 A | 12/1989 | Bird et al. |
| 4,908,681 A | 3/1990 | Nishida et al. |
| 4,945,254 A | 7/1990 | Robbins |
| 4,956,311 A | 9/1990 | Liou et al. |
| 5,034,337 A | 7/1991 | Mosher et al. |
| 5,144,378 A | 9/1992 | Hikosaka |
| 5,156,989 A | 10/1992 | Williams et al. |
| 5,156,990 A | 10/1992 | Mitchell |
| 5,166,765 A | 11/1992 | Lee et al. |
| 5,208,473 A | 5/1993 | Komori et al. |
| 5,294,821 A | 3/1994 | Iwamatsu |
| 5,298,763 A | 3/1994 | Shen et al. |
| 5,369,288 A | 11/1994 | Usuki |
| 5,373,186 A | 12/1994 | Schubert et al. |
| 5,384,476 A | 1/1995 | Nishizawa et al. |
| 5,426,328 A | 6/1995 | Yilmaz et al. |
| 5,444,008 A | 8/1995 | Han et al. |
| 5,552,332 A | 9/1996 | Tseng et al. |
| 5,559,368 A | 9/1996 | Hu et al. |
| 5,608,253 A | 3/1997 | Liu et al. |
| 5,622,880 A | 4/1997 | Burr et al. |
| 5,624,863 A | 4/1997 | Helm et al. |
| 5,625,568 A | 4/1997 | Edwards et al. |
| 5,641,980 A | 6/1997 | Yamaguchi et al. |
| 5,663,583 A | 9/1997 | Matloubian et al. |
| 5,712,501 A | 1/1998 | Davies et al. |
| 5,719,422 A | 2/1998 | Burr et al. |
| 5,726,488 A | 3/1998 | Watanabe et al. |
| 5,731,626 A | 3/1998 | Eaglesham et al. |
| 5,736,419 A | 4/1998 | Naem |
| 5,753,555 A | 5/1998 | Hada |
| 5,754,826 A | 5/1998 | Gamal et al. |
| 5,756,365 A | 5/1998 | Kakumu |
| 5,763,921 A | 6/1998 | Okumura et al. |
| 5,780,899 A | 7/1998 | Hu et al. |
| 5,847,419 A | 12/1998 | Imai et al. |
| 5,856,003 A | 1/1999 | Chiu |
| 5,861,334 A | 1/1999 | Rho |
| 5,877,049 A | 3/1999 | Liu et al. |
| 5,885,876 A | 3/1999 | Dennen |
| 5,889,315 A | 3/1999 | Farrenkopf et al. |
| 5,895,954 A | 4/1999 | Yasumura et al. |
| 5,899,714 A | 5/1999 | Farremkopf et al. |
| 5,918,129 A | 6/1999 | Fulford, Jr. et al. |
| 5,923,067 A | 7/1999 | Voldman |
| 5,923,987 A | 7/1999 | Burr |
| 5,936,868 A | 8/1999 | Hall |
| 5,946,214 A | 8/1999 | Heavlin et al. |
| 5,985,705 A | 11/1999 | Seliskar |
| 5,989,963 A | 11/1999 | Luning et al. |
| 6,001,695 A | 12/1999 | Wu |
| 6,020,227 A | 2/2000 | Bulucea |
| 6,043,139 A | 3/2000 | Eaglesham et al. |
| 6,060,345 A | 5/2000 | Hause et al. |
| 6,060,364 A | 5/2000 | Maszara et al. |
| 6,066,533 A | 5/2000 | Yu |
| 6,072,217 A | 6/2000 | Burr |
| 6,087,210 A | 7/2000 | Sohn |
| 6,087,691 A | 7/2000 | Hamamoto |
| 6,088,518 A | 7/2000 | Hsu |
| 6,091,286 A | 7/2000 | Blauschild |
| 6,096,611 A | 8/2000 | Wu |
| 6,103,562 A | 8/2000 | Son et al. |
| 6,121,153 A | 9/2000 | Kikkawa |
| 6,147,383 A | 11/2000 | Kuroda |
| 6,153,920 A | 11/2000 | Gossmann et al. |
| 6,157,073 A | 12/2000 | Lehongres |
| 6,175,582 B1 | 1/2001 | Naito et al. |
| 6,184,112 B1 | 2/2001 | Maszara et al. |
| 6,190,979 B1 | 2/2001 | Radens et al. |
| 6,194,259 B1 | 2/2001 | Nayak et al. |
| 6,198,157 B1 | 3/2001 | Ishida et al. |
| 6,218,892 B1 | 4/2001 | Soumyanath et al. |
| 6,218,895 B1 | 4/2001 | De et al. |
| 6,221,724 B1 | 4/2001 | Yu et al. |
| 6,229,188 B1 | 5/2001 | Aoki et al. |
| 6,232,164 B1 | 5/2001 | Tsai et al. |
| 6,235,597 B1 | 5/2001 | Miles |
| 6,245,618 B1 | 6/2001 | An et al. |
| 6,268,640 B1 | 7/2001 | Park et al. |
| 6,271,070 B2 | 8/2001 | Kotani et al. |
| 6,271,551 B1 | 8/2001 | Schmitz et al. |
| 6,288,429 B1 | 9/2001 | Iwata et al. |
| 6,297,132 B1 | 10/2001 | Zhang et al. |
| 6,300,177 B1 | 10/2001 | Sundaresan et al. |
| 6,313,489 B1 | 11/2001 | Letavic et al. |
| 6,319,799 B1 | 11/2001 | Ouyang et al. |
| 6,320,222 B1 | 11/2001 | Forbes et al. |
| 6,323,525 B1 | 11/2001 | Noguchi et al. |
| 6,326,666 B1 | 12/2001 | Bernstein et al. |
| 6,335,233 B1 | 1/2002 | Cho et al. |
| 6,358,806 B1 | 3/2002 | Puchner |
| 6,380,019 B1 | 4/2002 | Yu et al. |
| 6,391,752 B1 | 5/2002 | Colinge et al. |
| 6,426,260 B1 | 7/2002 | Hshieh |
| 6,426,279 B1 | 7/2002 | Huster et al. |
| 6,432,754 B1 | 8/2002 | Assaderaghi et al. |
| 6,444,550 B1 | 9/2002 | Hao et al. |
| 6,444,551 B1 | 9/2002 | Ku et al. |
| 6,449,749 B1 | 9/2002 | Stine |
| 6,461,920 B1 | 10/2002 | Shirahata |
| 6,461,928 B2 | 10/2002 | Rodder |
| 6,472,278 B1 | 10/2002 | Marshall et al. |
| 6,482,714 B1 | 11/2002 | Hieda et al. |
| 6,489,224 B1 | 12/2002 | Burr |
| 6,492,232 B1 | 12/2002 | Tang et al. |
| 6,500,739 B1 | 12/2002 | Wang et al. |
| 6,503,801 B1 | 1/2003 | Rouse et al. |
| 6,503,805 B2 | 1/2003 | Wang et al. |
| 6,506,640 B1 | 1/2003 | Ishida et al. |
| 6,518,623 B1 | 2/2003 | Oda et al. |
| 6,521,470 B1 | 2/2003 | Lin et al. |
| 6,534,373 B1 | 3/2003 | Yu |
| 6,541,328 B2 | 4/2003 | Whang et al. |
| 6,541,829 B2 | 4/2003 | Nishinohara et al. |
| 6,548,842 B1 | 4/2003 | Bulucea et al. |
| 6,551,885 B1 | 4/2003 | Yu |
| 6,552,377 B1 | 4/2003 | Yu |
| 6,573,129 B2 | 6/2003 | Hoke et al. |
| 6,576,535 B2 | 6/2003 | Drobny et al. |
| 6,600,200 B1 | 7/2003 | Lustig et al. |
| 6,620,671 B1 | 9/2003 | Wang et al. |
| 6,624,488 B1 | 9/2003 | Kim |
| 6,627,473 B1 | 9/2003 | Oikawa et al. |
| 6,630,710 B1 | 10/2003 | Augusto |
| 6,660,605 B1 | 12/2003 | Liu |
| 6,662,350 B2 | 12/2003 | Fried et al. |
| 6,667,200 B2 | 12/2003 | Sohn et al. |
| 6,670,260 B1 | 12/2003 | Yu et al. |
| 6,693,333 B1 | 2/2004 | Yu |
| 6,730,568 B2 | 5/2004 | Sohn |
| 6,737,724 B2 | 5/2004 | Hieda et al. |
| 6,743,291 B2 | 6/2004 | Ang et al. |
| 6,743,684 B2 | 6/2004 | Liu |

(56) References Cited

U.S. PATENT DOCUMENTS

| | | |
|---|---|---|
| 6,751,519 B1 | 6/2004 | Satya et al. |
| 6,753,230 B2 | 6/2004 | Sohn et al. |
| 6,760,900 B2 | 7/2004 | Rategh et al. |
| 6,770,944 B2 | 8/2004 | Nishinohara et al. |
| 6,787,424 B1 | 9/2004 | Yu |
| 6,794,901 B2 | 9/2004 | Bernstein |
| 6,797,553 B2 | 9/2004 | Adkisson et al. |
| 6,797,602 B1 | 9/2004 | Kluth et al. |
| 6,797,994 B1 | 9/2004 | Hoke et al. |
| 6,808,004 B2 | 10/2004 | Kamm et al. |
| 6,808,994 B1 | 10/2004 | Wang |
| 6,813,750 B2 | 11/2004 | Usami et al. |
| 6,821,825 B2 | 11/2004 | Todd et al. |
| 6,821,852 B2 | 11/2004 | Rhodes |
| 6,822,297 B2 | 11/2004 | Nandakumar et al. |
| 6,831,292 B2 | 12/2004 | Currie et al. |
| 6,835,639 B2 | 12/2004 | Rotondaro et al. |
| 6,842,046 B2 | 1/2005 | Tzartzanis |
| 6,852,602 B2 | 2/2005 | Kanzawa et al. |
| 6,852,603 B2 | 2/2005 | Chakravarthi et al. |
| 6,881,641 B2 | 4/2005 | Wieczorek et al. |
| 6,881,987 B2 | 4/2005 | Sohn |
| 6,891,439 B2 | 5/2005 | Jaehne et al. |
| 6,893,947 B2 | 5/2005 | Martinez et al. |
| 6,900,519 B2 | 5/2005 | Cantell et al. |
| 6,901,564 B2 | 5/2005 | Stine et al. |
| 6,916,698 B2 | 7/2005 | Mocuta et al. |
| 6,917,237 B1 | 7/2005 | Tschanz et al. |
| 6,927,463 B2 | 8/2005 | Iwata et al. |
| 6,928,128 B1 | 8/2005 | Sidiropoulos |
| 6,930,007 B2 | 8/2005 | Bu et al. |
| 6,930,360 B2 | 8/2005 | Yamauchi et al. |
| 6,957,163 B2 | 10/2005 | Ando |
| 6,963,090 B2 | 11/2005 | Passlack et al. |
| 6,995,397 B2 | 2/2006 | Yamashita et al. |
| 7,002,214 B1 | 2/2006 | Boyd et al. |
| 7,008,836 B2 | 3/2006 | Algotsson et al. |
| 7,013,359 B1 | 3/2006 | Li |
| 7,015,546 B2 | 3/2006 | Herr et al. |
| 7,015,741 B2 | 3/2006 | Tschanz et al. |
| 7,022,559 B2 | 4/2006 | Barnak et al. |
| 7,036,098 B2 | 4/2006 | Eleyan et al. |
| 7,038,258 B2 | 5/2006 | Liu et al. |
| 7,039,881 B2 | 5/2006 | Regan |
| 7,045,456 B2 | 5/2006 | Murto et al. |
| 7,057,216 B2 | 6/2006 | Ouyang et al. |
| 7,061,058 B2 | 6/2006 | Chakravarthi et al. |
| 7,064,039 B2 | 6/2006 | Liu |
| 7,064,399 B2 | 6/2006 | Babcock et al. |
| 7,071,103 B2 | 7/2006 | Chan et al. |
| 7,078,325 B2 | 7/2006 | Curello et al. |
| 7,078,776 B2 | 7/2006 | Nishinohara et al. |
| 7,089,513 B2 | 8/2006 | Bard et al. |
| 7,089,515 B2 | 8/2006 | Hanafi et al. |
| 7,091,093 B1 | 8/2006 | Noda et al. |
| 7,105,399 B1 | 9/2006 | Dakshina-Murthy et al. |
| 7,109,099 B2 | 9/2006 | Tan et al. |
| 7,119,381 B2 | 10/2006 | Passlack |
| 7,122,411 B2 | 10/2006 | Mouli |
| 7,127,687 B1 | 10/2006 | Signore |
| 7,132,323 B2 | 11/2006 | Haensch et al. |
| 7,169,675 B2 | 1/2007 | Tan et al. |
| 7,170,120 B2 | 1/2007 | Datta et al. |
| 7,176,137 B2 | 2/2007 | Perug et al. |
| 7,186,598 B2 | 3/2007 | Yamauchi et al. |
| 7,189,627 B2 | 3/2007 | Wu et al. |
| 7,199,430 B2 | 4/2007 | Babcock et al. |
| 7,202,517 B2 | 4/2007 | Dixit et al. |
| 7,208,354 B2 | 4/2007 | Bauer |
| 7,211,871 B2 | 5/2007 | Cho |
| 7,221,021 B2 | 5/2007 | Wu et al. |
| 7,223,646 B2 | 5/2007 | Miyashita et al. |
| 7,226,833 B2 | 6/2007 | White et al. |
| 7,226,843 B2 | 6/2007 | Weber et al. |
| 7,230,680 B2 | 6/2007 | Fujisawa et al. |
| 7,235,822 B2 | 6/2007 | Li |
| 7,256,639 B1 | 8/2007 | Koniaris et al. |
| 7,259,428 B2 | 8/2007 | Inaba |
| 7,260,562 B2 | 8/2007 | Czajkowski et al. |
| 7,294,877 B2 | 11/2007 | Rueckes et al. |
| 7,297,994 B2 | 11/2007 | Wieczorek et al. |
| 7,301,208 B2 | 11/2007 | Handa et al. |
| 7,304,350 B2 | 12/2007 | Misaki |
| 7,307,471 B2 | 12/2007 | Gammie et al. |
| 7,312,500 B2 | 12/2007 | Miyashita et al. |
| 7,323,754 B2 | 1/2008 | Ema et al. |
| 7,332,439 B2 | 2/2008 | Lindert et al. |
| 7,348,629 B2 | 3/2008 | Chu et al. |
| 7,354,833 B2 | 4/2008 | Liaw |
| 7,380,225 B2 | 5/2008 | Joshi et al. |
| 7,398,497 B2 | 7/2008 | Sato et al. |
| 7,402,207 B1 | 7/2008 | Besser et al. |
| 7,402,872 B2 | 7/2008 | Murthy et al. |
| 7,416,605 B2 | 8/2008 | Zollner et al. |
| 7,427,788 B2 | 9/2008 | Li et al. |
| 7,442,971 B2 | 10/2008 | Wirbeleit et al. |
| 7,449,733 B2 | 11/2008 | Inaba et al. |
| 7,462,908 B2 | 12/2008 | Bol et al. |
| 7,469,164 B2 | 12/2008 | Du-Nour |
| 7,470,593 B2 | 12/2008 | Rouh et al. |
| 7,485,536 B2 | 2/2009 | Jin et al. |
| 7,487,474 B2 | 2/2009 | Ciplickas et al. |
| 7,491,988 B2 | 2/2009 | Tolchinsky et al. |
| 7,494,861 B2 | 2/2009 | Chu et al. |
| 7,496,862 B2 | 2/2009 | Chang et al. |
| 7,496,867 B2 | 2/2009 | Turner et al. |
| 7,498,637 B2 | 3/2009 | Yamaoka et al. |
| 7,501,324 B2 | 3/2009 | Babcock et al. |
| 7,503,020 B2 | 3/2009 | Allen et al. |
| 7,507,999 B2 | 3/2009 | Kusumoto et al. |
| 7,514,766 B2 | 4/2009 | Yoshida |
| 7,521,323 B2 | 4/2009 | Surdeanu et al. |
| 7,531,393 B2 | 5/2009 | Doyle et al. |
| 7,531,836 B2 | 5/2009 | Liu et al. |
| 7,538,364 B2 | 5/2009 | Twynam |
| 7,538,412 B2 | 5/2009 | Schulze et al. |
| 7,562,233 B1 | 7/2009 | Sheng et al. |
| 7,564,105 B2 | 7/2009 | Chi et al. |
| 7,566,600 B2 | 7/2009 | Mouli |
| 7,569,456 B2 | 8/2009 | Ko et al. |
| 7,586,322 B1 | 9/2009 | Xu et al. |
| 7,592,241 B2 | 9/2009 | Takao |
| 7,595,243 B1 | 9/2009 | Bulucea et al. |
| 7,598,142 B2 | 10/2009 | Ranade et al. |
| 7,605,041 B2 | 10/2009 | Ema et al. |
| 7,605,060 B2 | 10/2009 | Meunier-Beillard et al. |
| 7,605,429 B2 | 10/2009 | Bernstein et al. |
| 7,608,496 B2 | 10/2009 | Chu |
| 7,615,802 B2 | 11/2009 | Elpelt et al. |
| 7,622,341 B2 | 11/2009 | Chudzik et al. |
| 7,638,380 B2 | 12/2009 | Pearce |
| 7,642,140 B2 | 1/2010 | Bae et al. |
| 7,644,377 B1 | 1/2010 | Saxe et al. |
| 7,645,665 B2 | 1/2010 | Kubo et al. |
| 7,651,920 B2 | 1/2010 | Siprak |
| 7,655,523 B2 | 2/2010 | Babcock et al. |
| 7,673,273 B2 | 3/2010 | Madurawe et al. |
| 7,675,126 B2 | 3/2010 | Cho |
| 7,675,317 B2 | 3/2010 | Perisetty |
| 7,678,638 B2 | 3/2010 | Chu et al. |
| 7,681,628 B2 | 3/2010 | Joshi et al. |
| 7,682,887 B2 | 3/2010 | Dokumaci et al. |
| 7,683,442 B1 | 3/2010 | Burr et al. |
| 7,696,000 B2 | 4/2010 | Liu et al. |
| 7,704,822 B2 | 4/2010 | Jeong |
| 7,704,844 B2 | 4/2010 | Zhu et al. |
| 7,709,828 B2 | 5/2010 | Braithwaite et al. |
| 7,723,750 B2 | 5/2010 | Zhu et al. |
| 7,737,472 B2 | 6/2010 | Kondo et al. |
| 7,741,138 B2 | 6/2010 | Cho |
| 7,741,200 B2 | 6/2010 | Cho et al. |
| 7,745,270 B2 | 6/2010 | Shah et al. |
| 7,750,374 B2 | 7/2010 | Capasso et al. |
| 7,750,381 B2 | 7/2010 | Hokazono et al. |

(56) References Cited

U.S. PATENT DOCUMENTS

| | | |
|---|---|---|
| 7,750,405 B2 | 7/2010 | Nowak |
| 7,750,682 B2 | 7/2010 | Bernstein et al. |
| 7,755,144 B2 | 7/2010 | Li et al. |
| 7,755,146 B2 | 7/2010 | Helm et al. |
| 7,759,206 B2 | 7/2010 | Luo et al. |
| 7,759,714 B2 | 7/2010 | Itoh et al. |
| 7,761,820 B2 | 7/2010 | Berger et al. |
| 7,795,677 B2 | 9/2010 | Bangsaruntip et al. |
| 7,808,045 B2 | 10/2010 | Kawahara et al. |
| 7,808,410 B2 | 10/2010 | Kim et al. |
| 7,811,873 B2 | 10/2010 | Mochizuki |
| 7,811,881 B2 | 10/2010 | Cheng et al. |
| 7,818,702 B2 | 10/2010 | Mandelman et al. |
| 7,821,066 B2 | 10/2010 | Lebby et al. |
| 7,829,402 B2 | 11/2010 | Matocha et al. |
| 7,831,873 B1 | 11/2010 | Trimberger et al. |
| 7,846,822 B2 | 12/2010 | Seebauer et al. |
| 7,855,118 B2 | 12/2010 | Hoentschel et al. |
| 7,859,013 B2 | 12/2010 | Chen et al. |
| 7,863,163 B2 | 1/2011 | Bauer |
| 7,867,835 B2 | 1/2011 | Lee et al. |
| 7,883,977 B2 | 2/2011 | Babcock et al. |
| 7,888,205 B2 | 2/2011 | Herner et al. |
| 7,888,747 B2 | 2/2011 | Hokazono |
| 7,895,546 B2 | 2/2011 | Lahner et al. |
| 7,897,495 B2 | 3/2011 | Ye et al. |
| 7,906,413 B2 | 3/2011 | Cardone et al. |
| 7,906,813 B2 | 3/2011 | Kato |
| 7,910,419 B2 | 3/2011 | Fenouillet-Beranger et al. |
| 7,919,791 B2 | 4/2011 | Flynn et al. |
| 7,926,018 B2 | 4/2011 | Moroz et al. |
| 7,935,984 B2 | 5/2011 | Nakano |
| 7,941,776 B2 | 5/2011 | Majumder et al. |
| 7,945,800 B2 | 5/2011 | Gomm et al. |
| 7,948,008 B2 | 5/2011 | Liu et al. |
| 7,952,147 B2 | 5/2011 | Ueno et al. |
| 7,960,232 B2 | 6/2011 | King et al. |
| 7,960,238 B2 | 6/2011 | Kohli et al. |
| 7,968,400 B2 | 6/2011 | Cai |
| 7,968,411 B2 | 6/2011 | Williford |
| 7,968,440 B2 | 6/2011 | Seebauer |
| 7,968,459 B2 | 6/2011 | Bedell et al. |
| 7,989,900 B2 | 8/2011 | Haensch et al. |
| 7,994,573 B2 | 8/2011 | Pan |
| 8,004,024 B2 | 8/2011 | Furukawa et al. |
| 8,012,827 B2 | 9/2011 | Yu et al. |
| 8,029,620 B2 | 10/2011 | Kim et al. |
| 8,039,332 B2 | 10/2011 | Bernard et al. |
| 8,046,598 B2 | 10/2011 | Lee |
| 8,048,791 B2 | 11/2011 | Hargrove et al. |
| 8,048,810 B2 | 11/2011 | Tsai et al. |
| 8,051,340 B2 | 11/2011 | Cranford, Jr. et al. |
| 8,053,340 B2 | 11/2011 | Colombeau et al. |
| 8,063,466 B2 | 11/2011 | Kurita |
| 8,067,279 B2 | 11/2011 | Sadra et al. |
| 8,067,280 B2 | 11/2011 | Wang et al. |
| 8,067,302 B2 | 11/2011 | Li |
| 8,076,719 B2 | 12/2011 | Zeng et al. |
| 8,097,529 B2 | 1/2012 | Krull et al. |
| 8,103,983 B2 | 1/2012 | Agarwal et al. |
| 8,105,891 B2 | 1/2012 | Yeh et al. |
| 8,106,424 B2 | 1/2012 | Schruefer |
| 8,106,481 B2 | 1/2012 | Rao |
| 8,110,487 B2 | 2/2012 | Griebenow et al. |
| 8,114,761 B2 | 2/2012 | Mandrekar et al. |
| 8,119,482 B2 | 2/2012 | Bhalla et al. |
| 8,120,069 B2 | 2/2012 | Hynecek |
| 8,129,246 B2 | 3/2012 | Babcock et al. |
| 8,129,797 B2 | 3/2012 | Chen et al. |
| 8,134,159 B2 | 3/2012 | Hokazono |
| 8,143,120 B2 | 3/2012 | Kerr et al. |
| 8,143,124 B2 | 3/2012 | Challa et al. |
| 8,143,678 B2 | 3/2012 | Kim et al. |
| 8,148,774 B2 | 4/2012 | Mori et al. |
| 8,163,619 B2 | 4/2012 | Yang et al. |
| 8,169,002 B2 | 5/2012 | Chang et al. |
| 8,170,857 B2 | 5/2012 | Joshi et al. |
| 8,173,499 B2 | 5/2012 | Chung et al. |
| 8,173,502 B2 | 5/2012 | Yan et al. |
| 8,176,461 B1 | 5/2012 | Trimberger |
| 8,178,430 B2 | 5/2012 | Kim et al. |
| 8,179,530 B2 | 5/2012 | Levy et al. |
| 8,183,096 B2 | 5/2012 | Wirbeleit |
| 8,183,107 B2 | 5/2012 | Mathur et al. |
| 8,185,865 B2 | 5/2012 | Gupta et al. |
| 8,187,959 B2 | 5/2012 | Pawlak et al. |
| 8,188,542 B2 | 5/2012 | Yoo et al. |
| 8,196,545 B2 | 6/2012 | Kurosawa |
| 8,201,122 B2 | 6/2012 | Dewey, III et al. |
| 8,214,190 B2 | 7/2012 | Joshi et al. |
| 8,217,423 B2 | 7/2012 | Liu et al. |
| 8,225,255 B2 | 7/2012 | Ouyang et al. |
| 8,227,307 B2 | 7/2012 | Chen et al. |
| 8,236,661 B2 | 8/2012 | Dennard et al. |
| 8,239,803 B2 | 8/2012 | Kobayashi |
| 8,247,300 B2 | 8/2012 | Babcock et al. |
| 8,255,843 B2 | 8/2012 | Chen et al. |
| 8,258,026 B2 | 9/2012 | Bulucea |
| 8,266,567 B2 | 9/2012 | El Yahyaoui et al. |
| 8,286,180 B2 | 10/2012 | Foo |
| 8,288,798 B2 | 10/2012 | Passlack |
| 8,299,562 B2 | 10/2012 | Li et al. |
| 8,324,059 B2 | 12/2012 | Guo et al. |
| 8,542,033 B2 | 9/2013 | Lee |
| 2001/0014495 A1 | 8/2001 | Yu |
| 2002/0042184 A1 | 4/2002 | Nandakumar et al. |
| 2002/0043990 A1* | 4/2002 | Akita ............... H03K 3/356156 326/113 |
| 2002/0047727 A1* | 4/2002 | Mizuno ............ H03K 19/1737 326/113 |
| 2003/0047763 A1 | 3/2003 | Hieda et al. |
| 2003/0122203 A1 | 7/2003 | Nishinohara et al. |
| 2003/0173626 A1 | 9/2003 | Burr |
| 2003/0183856 A1 | 10/2003 | Wieczorek et al. |
| 2003/0215992 A1 | 11/2003 | Sohn et al. |
| 2004/0075118 A1 | 4/2004 | Heinemann et al. |
| 2004/0075143 A1 | 4/2004 | Bae et al. |
| 2004/0084731 A1 | 5/2004 | Matsuda et al. |
| 2004/0087090 A1 | 5/2004 | Grudowski et al. |
| 2004/0126947 A1 | 7/2004 | Sohn |
| 2004/0175893 A1 | 9/2004 | Vatus et al. |
| 2004/0180488 A1 | 9/2004 | Lee |
| 2005/0106824 A1 | 5/2005 | Alberto et al. |
| 2005/0116282 A1 | 6/2005 | Pattanayak et al. |
| 2005/0250289 A1 | 11/2005 | Babcock et al. |
| 2005/0280075 A1 | 12/2005 | Ema et al. |
| 2006/0022270 A1 | 2/2006 | Boyd et al. |
| 2006/0049464 A1 | 3/2006 | Rao |
| 2006/0068555 A1 | 3/2006 | Zhu et al. |
| 2006/0068586 A1 | 3/2006 | Pain |
| 2006/0071278 A1 | 4/2006 | Takao |
| 2006/0154428 A1 | 7/2006 | Dokumaci |
| 2006/0197158 A1 | 9/2006 | Babcock et al. |
| 2006/0203581 A1 | 9/2006 | Joshi et al. |
| 2006/0220114 A1 | 10/2006 | Miyashita et al. |
| 2006/0223248 A1 | 10/2006 | Venugopal et al. |
| 2007/0040222 A1 | 2/2007 | Van Camp et al. |
| 2007/0117326 A1 | 5/2007 | Tan et al. |
| 2007/0158790 A1 | 7/2007 | Rao |
| 2007/0212861 A1 | 9/2007 | Chidambarrao et al. |
| 2007/0238253 A1 | 10/2007 | Tucker |
| 2008/0067589 A1 | 3/2008 | Ito et al. |
| 2008/0108208 A1 | 5/2008 | Arevalo et al. |
| 2008/0169493 A1 | 7/2008 | Lee et al. |
| 2008/0169516 A1 | 7/2008 | Chung |
| 2008/0197439 A1 | 8/2008 | Goerlach et al. |
| 2008/0227250 A1 | 9/2008 | Ranade et al. |
| 2008/0237661 A1 | 10/2008 | Ranade et al. |
| 2008/0258198 A1 | 10/2008 | Bojarczuk et al. |
| 2008/0272409 A1 | 11/2008 | Sonkusale et al. |
| 2009/0057746 A1 | 3/2009 | Sugll et al. |
| 2009/0108350 A1 | 4/2009 | Cai et al. |
| 2009/0134468 A1 | 5/2009 | Tsuchiya et al. |

(56) References Cited

U.S. PATENT DOCUMENTS

| | | | |
|---|---|---|---|
| 2009/0219053 A1* | 9/2009 | Masleid | H03K 17/005 326/113 |
| 2009/0224319 A1 | 9/2009 | Kohli | |
| 2009/0302388 A1 | 12/2009 | Cai et al. | |
| 2009/0309140 A1 | 12/2009 | Khamankar et al. | |
| 2009/0311837 A1 | 12/2009 | Kapoor | |
| 2009/0321849 A1 | 12/2009 | Miyamura et al. | |
| 2010/0012988 A1 | 1/2010 | Yang et al. | |
| 2010/0038724 A1 | 2/2010 | Anderson et al. | |
| 2010/0100856 A1 | 4/2010 | Mittal | |
| 2010/0148153 A1 | 6/2010 | Hudait et al. | |
| 2010/0149854 A1 | 6/2010 | Vora | |
| 2010/0187641 A1 | 7/2010 | Zhu et al. | |
| 2010/0207182 A1 | 8/2010 | Paschal | |
| 2010/0270600 A1 | 10/2010 | Inukai et al. | |
| 2011/0059588 A1 | 3/2011 | Kang | |
| 2011/0073961 A1 | 3/2011 | Dennard et al. | |
| 2011/0074498 A1 | 3/2011 | Thompson et al. | |
| 2011/0079860 A1 | 4/2011 | Verhulst | |
| 2011/0079861 A1 | 4/2011 | Shifren et al. | |
| 2011/0095811 A1 | 4/2011 | Chi et al. | |
| 2011/0147828 A1 | 6/2011 | Murthy et al. | |
| 2011/0169082 A1 | 7/2011 | Zhu et al. | |
| 2011/0175170 A1 | 7/2011 | Wang et al. | |
| 2011/0180880 A1 | 7/2011 | Chudzik et al. | |
| 2011/0193164 A1 | 8/2011 | Zhu | |
| 2011/0212590 A1 | 9/2011 | Wu et al. | |
| 2011/0230039 A1 | 9/2011 | Mowry et al. | |
| 2011/0242921 A1 | 10/2011 | Tran et al. | |
| 2011/0248352 A1 | 10/2011 | Shifren | |
| 2011/0294278 A1 | 12/2011 | Eguchi et al. | |
| 2011/0309447 A1 | 12/2011 | Arghavani et al. | |
| 2012/0021594 A1 | 1/2012 | Gurtej et al. | |
| 2012/0034745 A1 | 2/2012 | Colombeau et al. | |
| 2012/0056275 A1 | 3/2012 | Cai et al. | |
| 2012/0065920 A1 | 3/2012 | Nagumo et al. | |
| 2012/0108050 A1 | 5/2012 | Chen et al. | |
| 2012/0132998 A1 | 5/2012 | Kwon et al. | |
| 2012/0138953 A1 | 6/2012 | Cai et al. | |
| 2012/0146155 A1 | 6/2012 | Hoentschel et al. | |
| 2012/0167025 A1 | 6/2012 | Gillespie et al. | |
| 2012/0190177 A1 | 7/2012 | Kim et al. | |
| 2012/0223363 A1 | 9/2012 | Kronholz et al. | |

FOREIGN PATENT DOCUMENTS

| | | |
|---|---|---|
| EP | 0531621 | 3/1993 |
| EP | 0683515 | 11/1995 |
| EP | 0889502 | 1/1999 |
| EP | 1450394 | 8/2004 |
| JP | 59193066 | 11/1984 |
| JP | 4186774 | 7/1992 |
| JP | 8153873 | 6/1996 |
| JP | 8288508 | 11/1996 |
| JP | 2004087671 | 3/2004 |
| KR | 794094 | 1/2008 |
| WO | WO2011/062788 | 5/2011 |

OTHER PUBLICATIONS

Cheng, et al. "Extremely Thin SOI (ETSOI) CMOS with Record Low Variability for Low Power System-on-Chip Applications", Electron Devices Meeting (IEDM), Dec. 2009.

Cheng, et al. "Fully Depleted Extremely Thin SOI Technology Fabricated by a Novel Integration Scheme Feturing Implant-Free, Zero-Silicon-Loss, and Faceted Raised Source/Drain", Symposium on VLSI Technology Digest of Technical Papers, pp. 212-213, 2009.

Drennan, et al. "Implications of Proximity Effects for Analog Design", Custom Integrated Circuits Conference, pp. 169-176, Sep. 2006.

Hook, et al. "Lateral Ion Implant Straggle and Mask Proximity Effect", IEEE Transactions on Electron Devices, vol. 50, No. 9, pp. 1946-1951, Sep. 2003.

Hori, et al., "A 0.1 μm CMOS with a Step Channel Profile Formed by Ultra High Vacuum CVD and In-Situ Doped Ions", Proceedsing of the International Electron Devices Meeting, New York, IEEE, US, pp. 909-911, Dec. 5, 1993.

Matshuashi, et al. "High-Performance Double-Layer Epitaxial-Channel PMOSFET Compatible with a Single Gate CMOSFET", Symposium on VLSI Technology Digest of Technical Papers, pp. 36-37, 1996.

Shao, et al., "Boron Diffusion in Silicon: The Anomalies and Control by Point Defect Engineering", Materials Science and Engineering R: Reports, vol. 42, No. 3-4, pp. 65-114, Nov. 1, 2003, Nov. 2012.

Sheu, et al. "Modeling the Well-Edge Proximity Effect in Highly Scaled MOSFETs", IEEE Transactions on Electron Devices, vol. 53, No. 11, pp. 2792-2798, Nov. 2006.

Abiko, H et al., "A Channel Engineering Combined with Channel Epitaxy Optimization and TED Suppression for 0.15 μm n-n Gate CMOS Technology", 1995 Symposium on VLSI Technology Digest of Technical Papers, pp. 23-24, 1995.

Chau, R et al., "A 50nm Depleted-Substrate CMOS Transistor (DST)", Electron Device Meeting 2001, IEDM Technical Digest, IEEE International, pp. 29.1.1-29.1.4, 2001.

Ducroquet, F et al. "Fully Depleted Silicon-On-Insulator nMOSFETs with Tensile Strained High Carbon Content $Si_{1-y}C_y$ Channel", ECS 210th Meeting, Abstract 1033, 2006.

Ernst, T et al., "Nanoscaled MOSFET Transistors on Strained Si, SiGe, Ge Layers: Some Integration and Electrical Properties Features", ECS Trans. 2006, vol. 3, Issue 7, pp. 947-961, 2006.

Goesele, U et al., Diffusion Engineering by Carbon in Silicon, Mat. Res. Soc. Symp. vol. 610, 2000.

Hokazono, A et al., "Steep Channel & Halo Profiles Utilizing Boron-Diffusion-Barrier Layers (Si:C) for 32 nm Node and Beyond", 2008 Symposium on VLSI Technology Digest of Technical Papers, pp. 112-113, 2008.

Hokazono, A et al., "Steep Channel Profiles in n/pMOS Controlled by Boron-Doped Si:C Layers for Continual Bulk-CMOS Scaling", IEDM09-676 Symposium, pp. 29.1.1-29.1.4, 2009.

Holland, OW and Thomas, DK "A Method to Improve Activation of Implanted Dopants in SiC", Oak Ridge National Laboratory, Oak Ridge, TN, 2001.

Kotaki, H., et al., "Novel Bulk Dynamic Threshold Voltage MOSFET (B-DTMOS) with Advanced Isolation (SITOS) and Gate to Shallow-Well Contact (SSS-C) Processes for Ultra Low Power Dual Gate CMOS", IEDM 96, pp. 459-462, 1996.

Lavéant, P. "Incorporation, Diffusion and Agglomeration of Carbon in Silicon", Solid State Phenomena, vols. 82-84, pp. 189-194, 2002.

Komaragiri, R. et al., "Depletion-Free Poly Gate Electrode Architecture for Sub 100 Nanometer CMOS Devices with High-K Gate Dielectrics", IEEE IEDM Tech Dig., San Francisco CA, 833-836, Dec. 13-15, 2004.

Wong, H et al., "Nanoscale CMOS", Proceedings of the IEEE, Vo. 87, No. 4, pp. 537-570, Apr. 1999.

Noda, K et al., "A 0.1-μm Delta-Doped MOSFET Fabricated with Post-Low-Energy Implanting Selective Epitaxy" IEEE Transactions on Electron Devices, vol. 45, No. 4, pp. 809-814, Apr. 1998.

Ohguro, T et al., "An 0.18-μm CMOS for Mixed Digital and Analog Aplications with Zero-Volt-Vth Epitaxial-Channel MOSFET's", IEEE Transactions on Electron Devices, vol. 46, No. 7, pp. 1378-1383, Jul. 1999.

Pinacho, R et al., "Carbon in Silicon: Modeling of Diffusion and Clustering Mechanisms", Journal of Applied Physics, vol. 92, No. 3, pp. 1582-1588, Aug. 2002.

Robertson, LS et al., "The Effect of Impurities on Diffusion and Activation of Ion Implanted Boron in Silicon", Mat. Res. Soc. Symp. vol. 610, 2000.

Samsudin, K et al., "Integrating Intrinsic Parameter Fluctuation Description into BSIMSOI to Forcase sub-15nm UTB SOI based 6T SRAM Operation", Solid-Sate Electronics (50), pp. 86-93.

Scholz, R et al., "Carbon-Induced Undersaturation of Silicon Self-Interstitials", Appl. Phys. Lett. 72(2), pp. 200-202, Jan. 1998.

Scholz, RF et al., "The Contribution of Vacancies to Carbon Out-Diffusion in Silicon", Appl. Phys. Lett., vol. 74, No. 3, pp. 392-394, Jan. 1999.

(56) References Cited

OTHER PUBLICATIONS

Stolk, PA et al., "Physical Mechanisms of Transient Enhanced Dopant Diffusion in Ion-Implanted Silicon", J. Appl. Phys. 81(9), pp. 6031-6050, May 1997.
Thompson, S et al., "MOS Scaling: Transistor Challenges for the 21st Century", Intel Technology Journal Q3' 1998, pp. 1-19, 1998.
Wann, C. et al., "Channel Profile Optimization and Device Design for Low-Power High-Performance Dynamic-Threshold MOSFET", IEDM 96, pp. 113-116, 1996.
Werner, P et al., "Carbon Diffusion in Silicon", Applied Physics Letters, vol. 73, No. 17, pp. 2465-2467, Oct. 1998.
Yan, Ran-Hong et al., "Scaling the Si MOSFET: From Bulk to SOI to Bulk", IEEE Transactions on Electron Devices, vol. 39, No. 7, Jul. 1992.

\* cited by examiner

FIG. 6
| Circuit Technology | Temp | 3 σ 60 Stages | 3 σ 30 Stages | 3 σ 10 Stages |
|---|---|---|---|---|
| DDC DEVICES | 85 C | +/- 5.6 ps | +/- 4.1 ps | +/- 2.6 ps |
|  | 0 C | +/- 3.5 ps | +/- 2.7 ps | +/- 1.7 ps |
| Conventional | 85 C | +/- 10.7 ps | +/- 7.8 ps | +/- 4.7 ps |
|  | 0 C | +/- 5.5 ps | +/- 4.1 ps | +/- 2.5 ps |
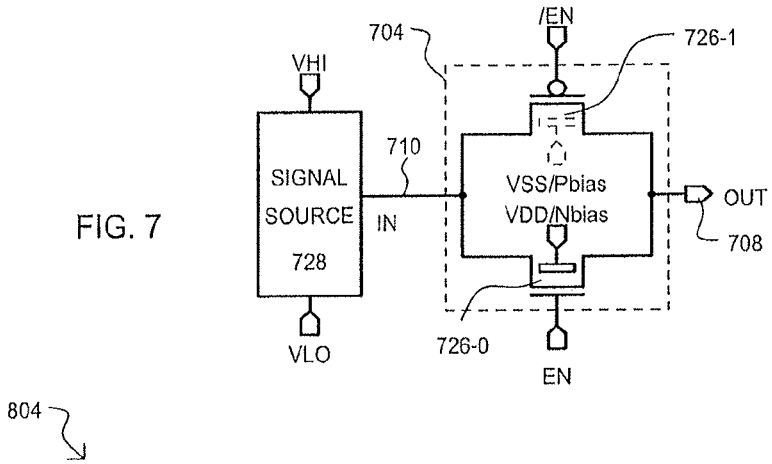
FIG. 7
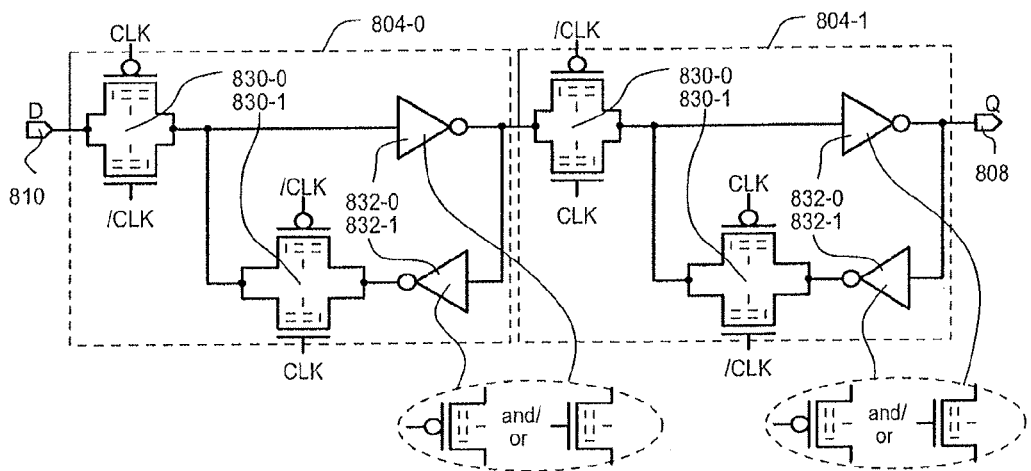
FIG. 8

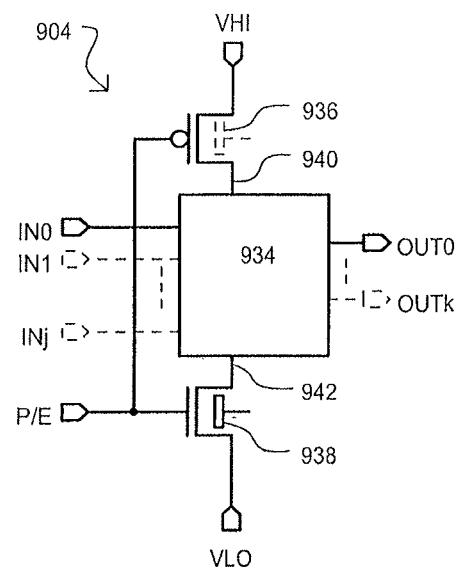
FIG. 9
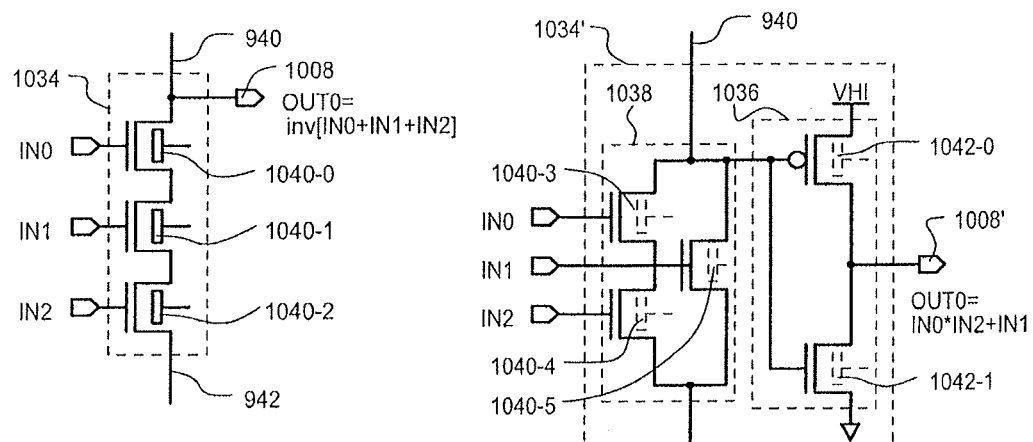
FIG. 10A
FIG. 10B

DIGITAL CIRCUITS HAVING IMPROVED TRANSISTORS, AND METHODS THEREFOR

CROSS REFERENCE TO RELATED APPLICATIONS

This application is a divisional application of U.S. application Ser. No. 14/867,506 filed Sep. 28, 2015 which is a divisional of U.S. application Ser. No. 13/891,929 filed May 10, 2013 which is a continuation application of U.S. application Ser. No. 13/030,939 filed Feb. 18, 2013 which is hereby incorporated herein by reference.

TECHNICAL FIELD

The present invention relates generally to electronic circuits, and more particularly to digital circuits for processing and/or storing digital values.

BACKGROUND

Electronic circuits, typically incorporated within integrated circuit (IC) devices, determine the function of various electronic systems, ranging from large systems (such as computer server "farms" that enable the wide variety of Internet services and businesses, and can include hundreds or even thousands of server computers), to the small portable electronic devices such as cellular telephones.

Electronic circuits typically include transistors interconnected to one another to a same integrated circuit substrate and/or package. An integrated circuit (IC) substrate may be a single semiconductor substrate (e.g., die created by dividing a fabricated "wafer") that includes circuit elements of the electronic circuit. An integrated circuit package may present a set of external connections, but include one or more ICs substrates and circuit components having conductive interconnections to one another.

Digital electronic circuits (hereinafter digital circuits) may form all or a portion of a large majority of circuits included within ICs. Digital circuits may receive and output digital values, typically binary values that vary between low and high logic levels.

Continuing goals for circuits (including digital circuits) include reductions in power consumption, improvements in performance, and reductions in area occupied by the circuit. Because ICs may employ vast numbers (up to millions) of digital circuits, even incremental reductions in power consumption may translate into significant power savings of devices or systems employing such circuits. In the case of large systems, reductions in power consumption can reduce power costs of an enterprise. In the case of portable electronic devices, reductions in power consumption can advantageously lead to longer battery life and/or the ability to provide additional functions for a given amount of charge.

Performance may include various aspects of circuit operation, including but not limited to: the speed at which data values transmitted and/or accessed by digital circuits. Improvements in signal propagation time (e.g., speed) may enable a device to increase the speed at which data is transmitted between locations of a device, thus reducing the time for the device to execute operations. In devices where data is stored, the speed at which data is written and/or read from storage locations may likewise improve device performance. Performance may also include circuit stability. Stability may be the ability of a circuit to provide a sufficient response under particular operating conditions.

Reductions in circuit size may directly translate into cost savings. In the case of ICs, reductions in size may allow more devices to fit on a fabrication substrate: As understood from above, digital circuits may occupy substantially all of the substrate area for some devices, and significant amount of are for others.

As device fabrication technologies approach limits to scaling (i.e., the ability to reduce circuit element sizes) the ability to further advance any of the goals noted above has grown increasingly costly or technically challenging.

BRIEF DESCRIPTION OF THE DRAWINGS

FIG. 6 is a table showing signal propagation simulation results for a clock tree according to an embodiment and according to a conventional approach.

FIG. 7 shows a passgate circuit according to an embodiment.

FIG. 8 shows a flip-flop circuit according to an embodiment.

FIG. 9 shows a dynamic logic circuit according to an embodiment.

FIGS. 10A and 10B show one of many logic sections that can be included in the embodiment of FIG. 9.

DETAILED DESCRIPTION

Figure 1:
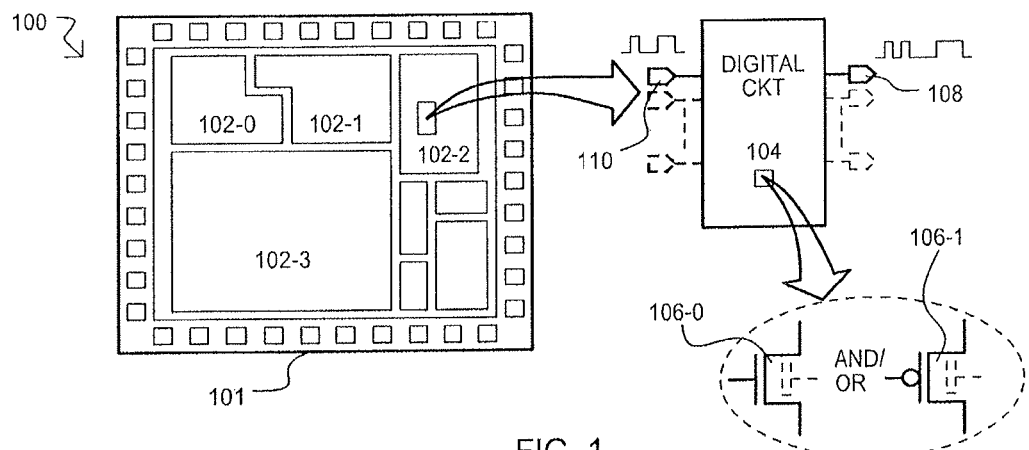
FIG. 1 shows an integrated circuit device according to an embodiment.

Various embodiments of the present invention will now be described in detail with reference to a number of drawings. The embodiments show digital circuits and related methods that may be included in integrated circuit devices to provide improved performance over conventional digital circuit approaches.

In the various embodiments below, like items are referred to by the same reference character but the leading digits corresponding to the figure number.

Referring now to FIG. 1 an integrated circuit (IC) device according to one embodiment is show in a top plan view, and designated by the general reference character 100. An IC device 100 may be formed as a "die" having substrate 101 containing the various circuits therein. An IC device 100 may include one or more circuit sections, and FIG. 1 identifies four circuit sections as 102-0 to 102-3. Any or all of circuit sections (102-0 to 102-3) may include digital circuit blocks that perform digital functions for the IC device 100.

In the embodiment shown, circuit section 102-2 may be a digital circuit block that includes one or more digital circuits, one shown as 104. A digital circuit 104 may generate output signals on one or more output nodes (e.g., 108) in response to input signals received on one or more input nodes (e.g., 110). It is noted that in some embodiments, an output node and input node may be the same node.

Referring still to FIG. 1, a digital circuit 104 may include one or more "deeply depleted channel" (DDC) transistors. A DDC transistor includes both a highly doped "screening" layer below a gate that defines the extent of the depletion region below the gate in operation, and an undoped channel extending between source and drain of a transistor. Typically, to prevent contamination of the undoped channel, transistors are manufactured without halo or "pocket" implants, and anneal conditions are tightly controlled to prevent unwanted diffusion of dopants into the undoped channel. While conventional threshold voltage (Vt) implants are also avoided to prevent channel contamination, Vt set layers that are grown as blanket or selective epitaxial layers on the screening layer can be used to finely adjust or tune the threshold voltage of individual or blocks of transistors. Further examples of DDC transistor structure and manufacture are disclosed in U.S. patent application Ser. No. 12/708,497, filed on Feb. 18, 2010, titled ELECTRONIC DEVICES AND SYSTEMS, AND METHODS FOR MAKING AND USING THE SAME, by Scott E. Thompson et al., as well as U.S. patent application Ser. No. 12/971,884, filed on Dec. 17, 2010 titled LOW POWER SEMICONDUCTOR TRANSISTOR STRUCTURE AND METHOD OF FABRICATION THEREOF and U.S. patent application Ser. No. 12/971,955 filed on Dec. 17, 2010 titled TRANSISTOR WITH THRESHOLD VOLTAGE SET NOTCH AND METHOD OF FABRICATION THEREOF the respective contents of which are incorporated by reference herein.

DDC transistors included within a digital circuit may include n-channel transistors, p-channel transistors or both. N-channel DDC transistors will be represented in this disclosure by the symbol shown as 106-0 in FIG. 1. P-channel DDC transistors will be represented in this disclosure by the symbol shown as 106-1 in FIG. 1. DDC transistors may advantageously include a substantially undoped channel region formed over a relatively highly doped screening layer.

Figure 2A:
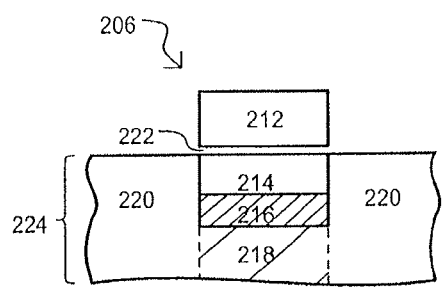
FIG. 2A shows a deeply depleted channel (DOC) transistor that may be included in embodiments.

Specifically referring now to FIG. 2A, one exemplary representation of a DDC transistor is shown in a side cross sectional view, and designated by the general reference character 206. DDC transistor 206 may include a gate 212 separated from a substrate 224 by a gate insulator 222. A substantially undoped channel region 214 may be formed below gate 212. A doped screening layer 216 may be formed below channel region 214. It is understood that there may be other layers between channel region 214 and screening layer 216. A substrate 224 may be formed of more than one semiconductor layer. As but one example, a substrate may include one or more "epitaxial" layers formed on a bulk semiconductor substrate.

A screening layer 216 may be doped to an opposite conductivity type of the transistor channel type (e.g., an n-channel DDC transistor will have a p-doped screening layer). A screening layer 216 doping concentration may be greater than a concentration of a body region 218. FIG. 2A also shows source and drain regions 220 on opposing lateral sides of channel region 214. Source and drain regions 220 may include a source and drain diffusion. More particular types of DDC source and drain structures, relative to substantially undoped channel region will be described in more detail below.

Figure 2B:
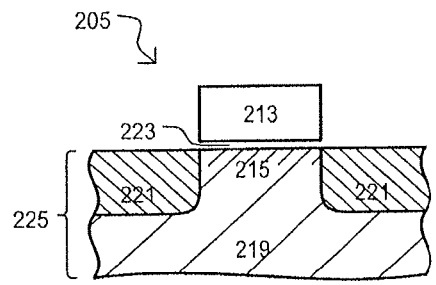
FIG. 2B shows a conventional transistor.

Referring to FIG. 2B, one representation of a conventional transistor is shown for comparison to that shown in FIG. 2A. Conventional transistor 205 may include a gate 213 separated from a substrate 225 by a gate insulator 223. A channel region 215 may be formed below a gate 213 between source/drain diffusions 221. A channel region 215 may be doped to a conductivity type opposite to that of source/drain diffusions 221, and the same as that of a transistor body region 219.

In this way, a digital circuit may be formed with one or more DDC transistors.

Figure 3A:
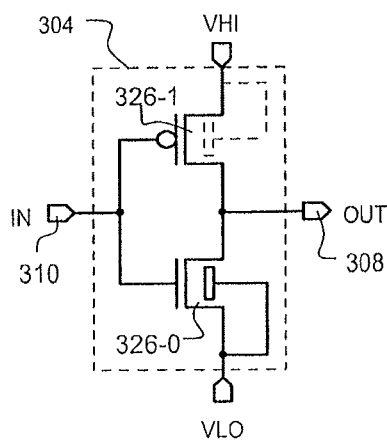
FIGS. 3A and 3B show inverter circuits according to embodiments.

Referring now to FIG. 3A one example of a digital circuit according to an embodiment is shown in a schematic diagram, and designated by the general reference character 304. Digital circuit 304 may be an inverter that inverts an input signal received on an input node 310 to generate an output signal OUT on an output node 308. Digital circuit 304 may include a pull-down transistor 326-0 and a pull-up transistor 326-1 that 30 drive output node 308 between a high logic level (e.g., VHI) and a low logic level (e.g., VLO). In the embodiment shown, pull-up transistor 326-1 may be an re-channel DDC transistor, while pull-up transistor 326-1 may optionally be a p-channel DDC transistor (as indicated by hashing). However, in alternate embodiments all or anyone of the transistors may be a DDC transistor. It is noted that FIG. 3A shows a "static" logic embodiment where a signal generated on output node 308 may have a value, a timing established by input signal IN.

In the embodiment of FIG. 3A, transistors 326-0/1 have source tied "bodies". Thus, any screening region of a transistor may be driven with logic supply voltage (Le., a logic high or low voltage shown as VHI and VLO).

Figure 3B:
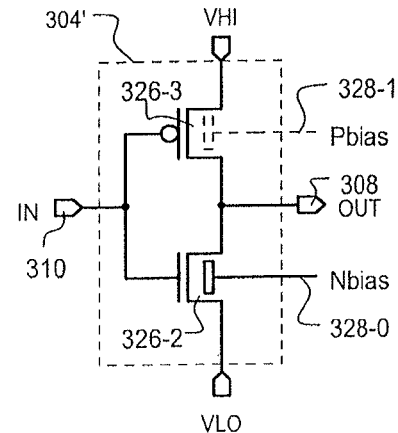

FIG. 3B shows a digital circuit 304' having a configuration with similar connections to those of FIG. 3A. However, unlike FIG. 3A, transistors (326-2/3) of FIG. 3B may have body bias voltages different than corresponding drain voltages. Thus, a screening region of any such independent body transistor may be driven with a body bias voltage (shown as Pbias, Nbias) that may be different than drain voltages. A body bias voltage may be static or dynamic. In embodiments having DDC transistors of both conductivity types, one or both types of transistors may receive a body bias voltage. In embodiments having a DDC transistor and non-DDC transistor, one or both types of transistors may receive a body bias voltage.

In this way, an inverter may include one or more DDC transistors with or without separately biased bodies.

Figure 4A:
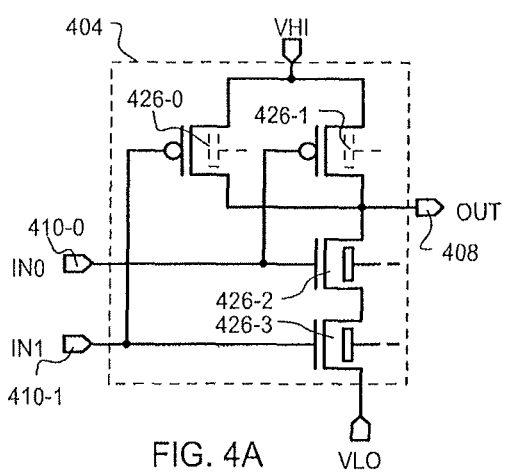
FIGS. 4A and 4B show NAND and NOR logic circuits according to embodiments.
Figure 4B:
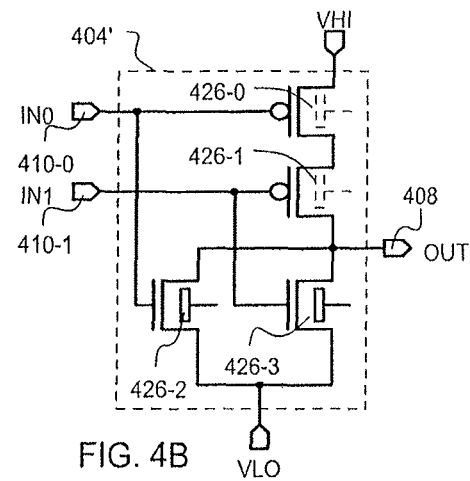

Referring now to FIGS. 4A and 4B, additional digital circuits according to embodiments are shown in block schematic diagrams, and designated by the general reference characters 404 and 404', respectively. Digital circuit 404/404' may include multiple transistors (426-0 to -3) interconnected to one another between a high logic node VHI and low logic node VLO. The transistor types and body connections may vary as noted for FIGS. 3A and 3B. In particular, any number (including all) transistors may be DDC transistors. Further, any number (including all) transistors (regardless of whether they DDC transistors or not), may have bodies connected to a logic high or low voltage, or may have bodies biased with a different voltage (such a body bias voltage being static or dynamic). FIG. 4A shows a static logic NAND gate, while FIG. 4B shows a static logic NOR gate. From these logic gates one skilled in the art could arrive at more complex logic circuits that may include DDC type transistors.

Digital circuits employing DDC transistors as described herein, and equivalents, may provide a wider range of performance modulation than conventional approaches. As noted above, in various logic circuits shown herein, bodies of DDC transistors may be biased with a voltage other than a logic high or logic low voltage. Such body biasing of DDC transistors may provide for greater variation in transistor threshold voltage per applied body bias, as compared to doped channel devices. One very particular example of such bias variation is shown in FIG. 4C.

Figure 4C:
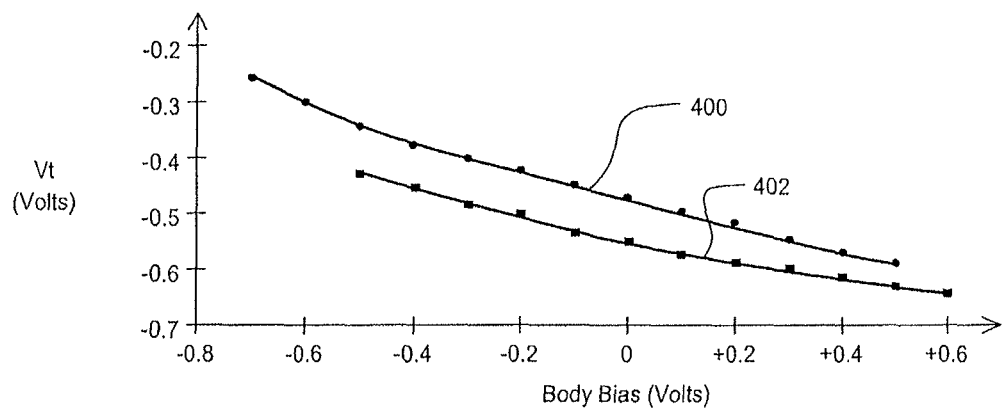
FIG. 4C is a graph illustrating simulation results of a threshold voltage (Vt) of a DOC device at various bias voltages.

FIG. 4C is a graph showing simulation results of a threshold voltage (Vt) of a DDC device at various bias voltages. Curve 400 represents results corresponding to a 500 nanometer (nm) gate length DDC transistor. Curve 402 shows a conventional 500 nm transistor response. It is understood that FIG. 4C is but one response, and such biasing response may vary according to device geometry, doping, screening channel position, any Vt adjustment layer, gate insulator thickness, gate material, to name but a few examples.

Digital circuits employing DDC transistor as described herein, may vary operations with body biasing. For example, higher body bias may be utilized to reduce power in standby states. Such body biasing may also vary with changes in logic levels, which may be a power supply voltage in some embodiments (e.g., VHI=VDD, VLO=VSS).

Figure 5:
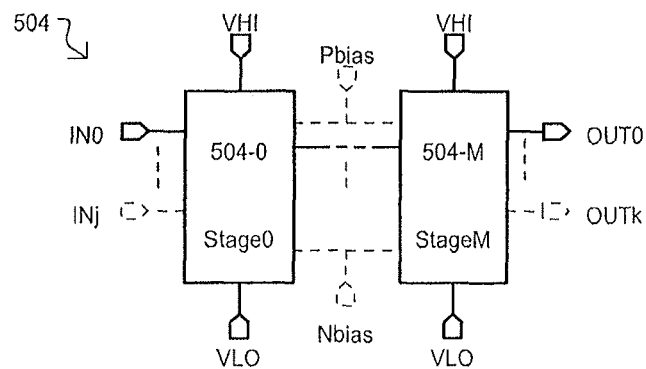
FIG. 5 shows a digital circuit according to an embodiment that includes serially connected digital stages.

Referring now to FIG. 5, a digital circuit according to a further embodiment is shown in a block schematic diagram, and designated by the general reference character 504. A digital circuit 504 may include a series of stages 504-0 to -M, where each stage may be a logic circuit as described herein or an equivalent. One or more input signals (IN0 to INj) may be logically operated on, to propagate signals through stages (504-0 to -M) and generate one or more output stages OUT0 to OUTk. That is, each of stages (504-0 to -M) may drive nodes within between logic high (VHI) and logic low (VLO) levels.

Such digital circuits that include stages with DDC transistors may have various advantageous features over conventional digital circuits as would be understood by those skilled in the art in light of the various discussions herein. However, in particular embodiments, digital circuits that employ DDC devices may have less variation in response. Consequently, when such digital circuits include stages, as shown in FIG. 5, an average expected signal propagation time may exhibit less variation, and hence be faster.

FIG. 6 is a table showing simulation data comparing digital circuits according embodiments (DDC DEVICES) versus a corresponding conventional approach. The digital circuits of FIG. 6 may be signal distribution chains composed of a number of stages (60, 30, 10), where each stage includes an inverter. That is, the DDC DEVICES may be one implementation of that shown in FIG. 5, where each stage includes an inverter like that of FIG. 2A.

FIG. 6 shows results for high and low simulation temperatures (i.e., 0° C. and 85° C.) for signal chains of 60 stages, 30 stages and 10 stages. Results are given as 3σ distributions. As shown, distributions may be tighter in the DDC DEVICES cases. Such tighter distributions may allow for faster signal distribution and/or processing environments, improving a device or system performance.

In this way, digital circuits having series connected stages may include DDC devices to reduce signal propagation time.

While embodiments may include DDC transistors that drive nodes between high and/or a low logic levels, other embodiments may serve to pass signals from one node to another. One such embodiment is shown in FIG. 7.

Referring now to FIG. 7 one example of a passgate circuit according to an embodiment is shown in a schematic diagram, and designated by the general reference character 704. Passgate circuit 704 may receive an input signal (IN) on an input node 710 from a signal source 728 and pass such a signal to an output node 708. Such signals may vary between high and low logic levels (VHI and VLO). Passgate circuit 704 may include, first and second transistors 726-0 and 726-1 of different conductivity types having source-drain paths arranged in parallel to one another between an input node 710 and an output node 708. Transistors 726-0 and 726-1 may receive complementary enable signals EN and /EN at their gates, respectively.

It is understood that either (or both) transistors may be DDC transistors. Further, either or both transistors (regardless of whether they DDC transistors or not), may have bodies driven by high or low logic levels (VHI or VLO), or bodies static or dynamically biased to different voltages.

Embodiment may also include passgate and logic combinations. One such particular embodiment is shown in FIG. 8.

Referring now to FIG. 8, one example of a flip-flop circuit according to an embodiment is shown in a schematic diagram, and designated by the general reference character 804. Passgate circuit 804 may include two stages 804-0/1, each of which includes an input passgate 830-0 and clocked latch formed by a latch passgate 830-1 and cross coupled latch inverters 832-0/1. Stages 804-0/1 may be enabled on complementary clock duty cycles. That is, as data is input to stage 804-0, data may be latched in stage 804-1 (e.g., CLK low), and as data is latched in stage 804-0, it may be input to stage 804-1 (e.g., CLK high).

Any of passgates 830-0/1 may take the form of those passgate embodiments shown herein, or equivalents. Similarly, any of inverters 830-0/1 may take the form inverter embodiment shown herein, or equivalents. Accordingly, any or both of passgates 830-0/1 may include DDC transistors, or may have separately biased bodies. Further, any or all of inverters 830-0/1 may include one or more DDC transistors, with any such DDC transistor having a bodies tied to a logic level, or biased to some other voltage.

Embodiments like those of FIGS. 3A to 4B have shown "static" logic circuit in which an output value and timing may be established by input signals. Alternate embodiments may include "dynamic" logic approaches. In a dynamic logic embodiment, an output logic level may be determined according to input signals, however a timing of such an output signal may be established by one or more timing signals. Particular dynamic logic circuits embodiments are shown in FIGS. 9 to 10B.

Referring now to FIG. 9, one example of a dynamic logic circuit according to an embodiment is shown in a schematic diagram, and designated by the general reference character

904. A dynamic logic circuit 904 may include a precharge transistor 936, an evaluation transistor 938, and a logic section 934. A precharge transistor 936 may connect a precharge node 940 to a logic high level (VHI) in response to a timing signal (P/E) being low. An evaluation transistor 938 may connect a discharge node 942 to a low logic level (VLO) in response to the timing signal (P/E) being high. A logic section 934 may receive one or more input signals (IN0 to INj) and provide one or more output signals (OUT0 to OUTk). Input signals (IN0 to INj) may determine a state of any output signals (OUT0 to OUTk). However the timing of such a determination may be controlled according to timing signal (PIE).

While FIG. 9 shows precharge and evaluation transistors (936 and 938) being enabled/disabled in response to the same timing signal P/E, alternate embodiments may utilize separate signals to enable and disable such devices.

In some embodiments, a precharge transistor 936, an evaluation transistor 938, or both, may be DDC transistors. In addition or alternatively, a logic section 934 may include one or more DDC transistors. As in other embodiments above, DDC transistors may have logic level tied bodies, or bodies statically or dynamically biased to other levels.

Referring now to FIGS. 10A and 10B, logic sections according to particular embodiments that may be included in a dynamic logic circuit, like that of FIG. 9, are shown in schematic diagrams.

Referring to FIG. 10A, a logic section 1034 may include a number of logic transistors 1040-0 to 1040-2 that can selectively connect an output node 1008 to a precharge node 940 or a discharge node 942 in response to input values (IN0 to IN2). Any or all of such transistors may be DDC transistors. In the embodiment of FIG. 10A, all logic transistors 1040-0 to -2 may have source-drain paths that are connected to a logic high or low level through a corresponding precharge or evaluation device (not shown in FIG. 10A). In the very particular embodiment shown, logic section 1034 may provide a logic function where an output signal OUT0=inverse [IN0+IN1+IN2].

Referring to FIG. 10B, a logic section 1034' may include an evaluation section 1038 and an output inverter 1036. An evaluation section 1038 can selectively connect an input of inverter 1036 a precharge node 940 or a discharge node 942 in response to input values (IN0 to IN2), and according to a timing established by corresponding precharge or evaluation devices (not shown in FIG. 10B). Any or all the transistors within evaluation section 1038 may be DDC transistors. Output inverter 1036 may drive output node 1008' according to an output of evaluation section 1038. In the very particular embodiment shown, logic section 1034' may provide a logic function where an output signal OUT0=IN0*IN2+IN1.

One skilled in the art could arrive at various other logic functions according to teachings set forth.

In this way, dynamic logic circuits may include one or more DDC devices.

From the above examples, one skilled in the art would recognize that digital circuits according to the embodiments may include logic circuit conventions beyond static and dynamic approaches. As but one example, other embodiments may include "current steering" logic approaches. In a current steering embodiment, an output logic level may be determined by steering current from two current paths according to received input signals. Particular current steering logic circuit embodiments are shown in FIGS. 11 to 12B.

Figure 11:
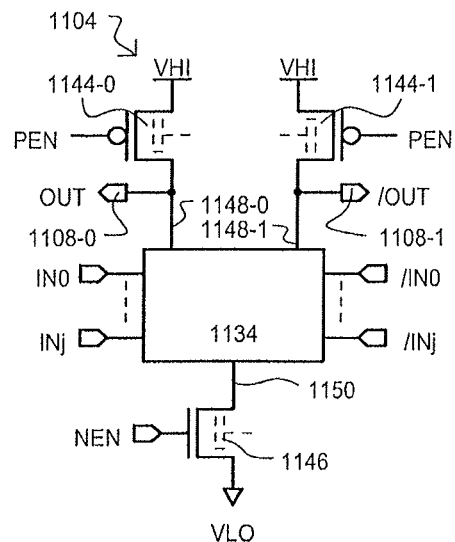
FIG. 11 shows a current steering logic circuit according to an embodiment.

Referring now to FIG. 11, one example of a current steering circuit according to an embodiment is shown in a block schematic diagram, and designated by the general reference character 1104. A current steering logic circuit 1104 may include respective output nodes 1108-0 and 1108-1, a first current source 1144-0, a second current source 1144-1, a current sink 1146, and a logic section 1134. First and second current sources 1144-0/1 may be connected in parallel between a logic high node VHI and a logic section 1134. First current source 1144-0 may provide a current to logic section 1134 via a first input current path 1148-0, and second current source 1144-1 may provide a current to logic section 1134 via a second input current path 1148-1. According to input values (in this embodiment, IN0 to INj and their complements), a logic section 1134 may steer current from either input current path 1148-0/1 to current sink 1146, and thus generate complementary output signals on such current paths 1148-0/1. A current sink 1146 may provide a current path to a low voltage node VLO through sink current path 1150.

In the particular embodiment of FIG. 11, first and second current sources 1144-0/1 may be p-channel transistors, which in particular embodiments may be DDC transistors. Similarly, current sink 1146 may be an re-channel transistor, which may in particular embodiments, be a DDC transistor. As in other embodiments above, such DDC transistors may have bodies tied to logic levels, or have bodies driven by another voltage, either statically or dynamically.

Figure 12A:
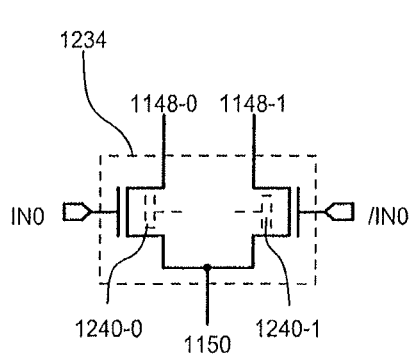
FIGS. 12A and 12B show one of many logic sections that can be included in the embodiment of FIG. 11.
Figure 12B:
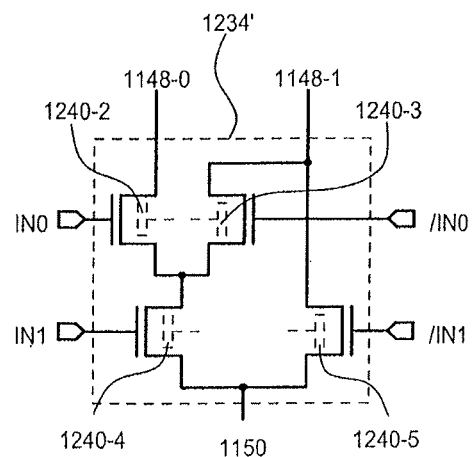

Referring now to FIGS. 12A and 12B, logic sections according to particular embodiments that may be included in a current steering logic circuit, like that of FIG. 11, are shown in schematic diagrams.

Referring to FIG. 12A, a logic section 1234 may include logic transistors 1240-0 and 1240-1 that can selectively steer either of input current paths 1148-0/1 to current sink path 1150 according to an input values (IN0 and its complement). When current is steered down one path and not the other, complementary output values may be generated at input current paths 1148-0/1. Any or all of such transistors may be DDC transistors subject to the various body biasing configurations noted herein. In the embodiment of FIG. 12A, logic section 1234 may provide a logic function of a buffer or an inverter, depending upon which input values and output nodes are considered.

Referring to FIG. 12B, a logic section 1234' may include a more complex arrangement of logic transistors 1240-2 to 1240-5. However, operations may occur in the same generation fashion as FIG. 12A, with such transistors (1240-2 to 1240-5) selectively steering current from one of steering current paths 1148-0/1 to current sink path 1150, to generate complementary output values at input current paths 1148-0/1. Any or all of such transistors may be DDC transistors subject to the various body biasing configurations noted herein. In the embodiment of FIG. 12B, logic section 1234' may provide a NAND, NOR, AND or OR function depending upon which input values and output nodes are considered.

In this way, current steering logic circuits may include one or more DDC devices.

While the flip-flop embodiments shown above may store data values, embodiments may include more compact digital data storage circuits. In particular, embodiments may include latches, and in particular embodiments, latches and memory cells with symmetrical matching devices.

Figure 13:
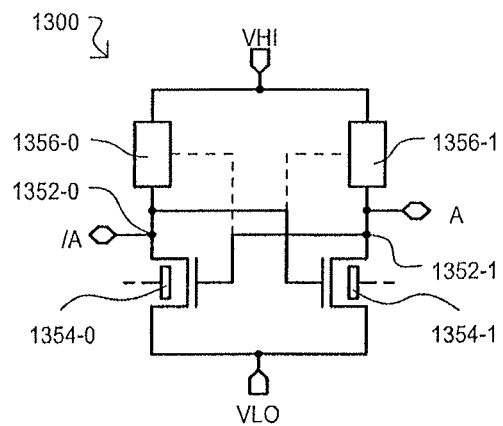
FIG. 13 shows a latch circuit according to an embodiment.

Referring now to FIG. 13, a latch according to an embodiment is shown in a schematic diagram and designated by the general reference character 1300. A latch 1300 may include driver transistors 1354-0/1 and load devices 1356-0/1. Driver transistors 1354-0/1 may be cross-coupled between complementary data nodes 1352-0/1, having source-drain paths connected to a first logic level (in this case VLO), with a gate of one transistor being connected to the drain of the other. Load devices 1356-0/1 may be passive or active devices, connected in parallel between data nodes 1352-0/1 and second logic level (in this case VHI).

Driver transistors 1354-0/1 may be DDC transistors, and in particular embodiments, matching DDC transistors. DDC driver transistors may have bodies driven to logic levels, or to some other bias voltage, dynamically and/or statically.

A latch 1300 may store a data value on complementary data nodes 1352-0/1, and may form part of various memory cell types, including but not limited to four transistor (4T), 6T, and 8T static random access memory (SRAM) cells, to name but a few. Further, while FIG. 13 shows a latch with n-channel driver transistors, alternate embodiments may include p-channel driver transistors. In this way, a latch circuit may include DDC driver devices.

Figure 14:
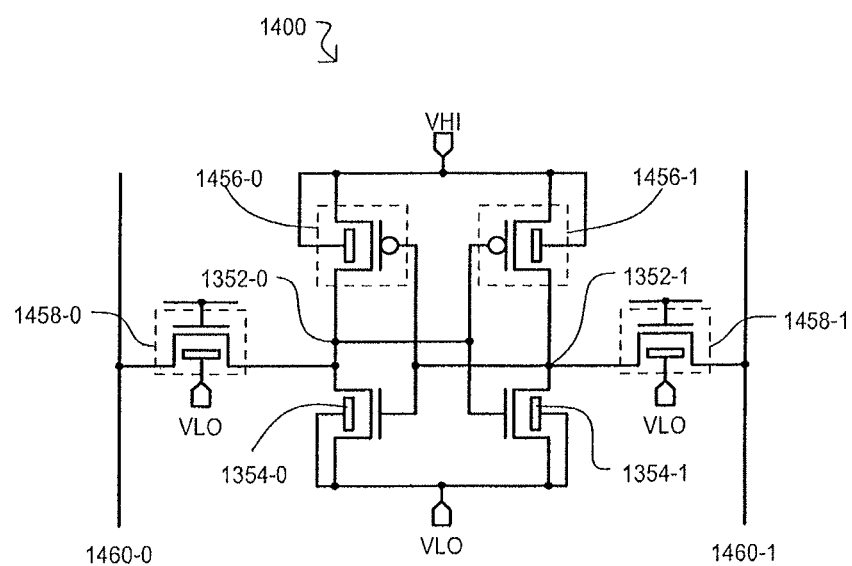
FIG. 14 shows a six transistor (6-T) static random access memory (SRAM) cell according to an embodiment.

Referring now to FIG. 14, a 6-T SRAM cell according to one embodiment is shown in schematic diagram and designated by the general reference character 1400. An SRAM cell 1400 may include items like those shown in FIG. 13, and such like items are referred to by the same reference character.

FIG. 14 differs from FIG. 13 in that load devices may be p-channel transistors 1456-0/1 cross coupled to one another. Further, n-channel access transistors 1458-0 and 1458-1 may connect bit lines 1460-0 and 1460-1 to data nodes 1352-0 and 1352-1, respectively. In the embodiment of FIG. 14, all transistors may have bodies connected to a logic high or logic low level, according to conductivity type. Further all transistors may be DDC transistors. Still further, transistors may match one another in a symmetrical fashion. That is, transistors 1456-0, 1458-0, and 1354-0 may be the same size as, and fabricated in the same fashion as corresponding transistors 1456-1, 1458-1, and 1354-1 respectively.

As will be described in more detail below, DDC transistors, by employing a substantially undoped channel, may provide less threshold variation than conventional transistors, as such channels are less (or not) susceptible to random doping fluctuation (RDF). Consequently, a symmetrical latching structure may provide performance advantages over conventional latch circuits having doped channels subject to RDF.

Figure 15A:
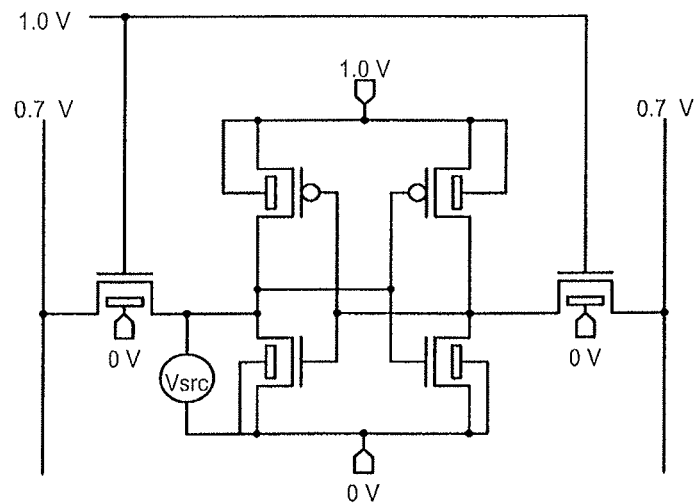
FIGS. 15A and 15B show simulation conditions and results for a 6-T SRAM cell according to one embodiment.
Figure 15B:
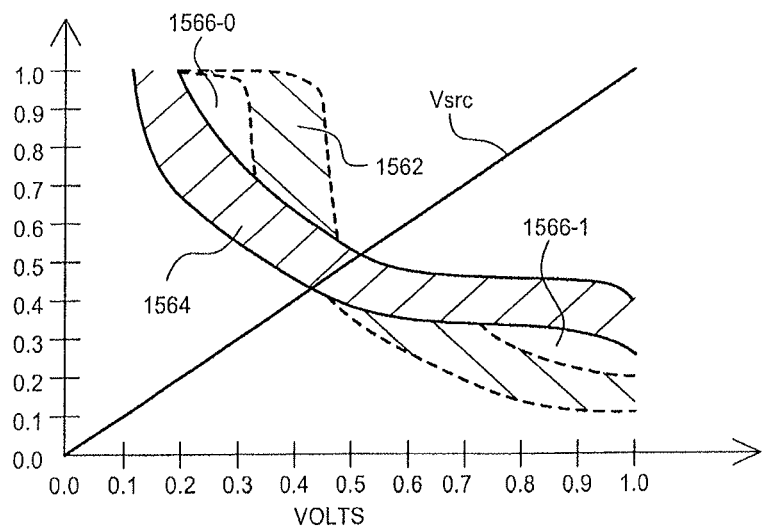

Referring now to FIGS. 15A and 15B, a response of a 6-T SRAM cell according to an embodiment is shown. FIG. 15A is a schematic diagram showing a 6-T cell like that of FIG. 14 under static noise margin (SNM) simulation conditions. Transistors in such a 6-T SRAM cell may have gate lengths of 28 nm. In the particular conditions shown, bit lines may held at 0.7 volts, access devices may be driven to 1.0 V, and a high voltage (VHI) is 1.0 V, while a low voltage (VLO) is 0 V. A sweeping voltage (Vsrc) is applied between VLO and a data storage node that transitions from 0 V to 1.0 V, and then back again.

FIG. 15B is a graph showing a response of the 6-T SRAM cell of FIG. 15 under the noted simulation conditions. FIG. 15B shows two response variation ranges 1564 and 1562 showing responses to different sweep directions of Vsrc. As shown, responses 1564 and 1562 include "eye" regions 1566-0 and 1566-1 that indicate stable switching between states.

Figure 16A:
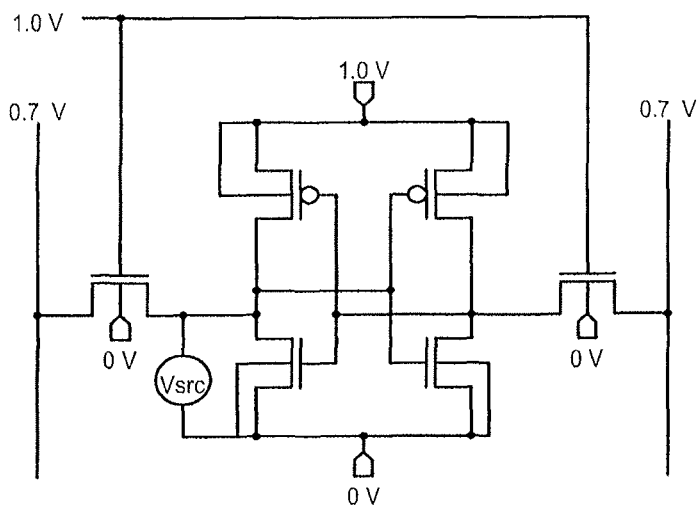
FIGS. 16A and 16B show simulation conditions and results for a conventional 6-T SRAM cell.
Figure 16B:
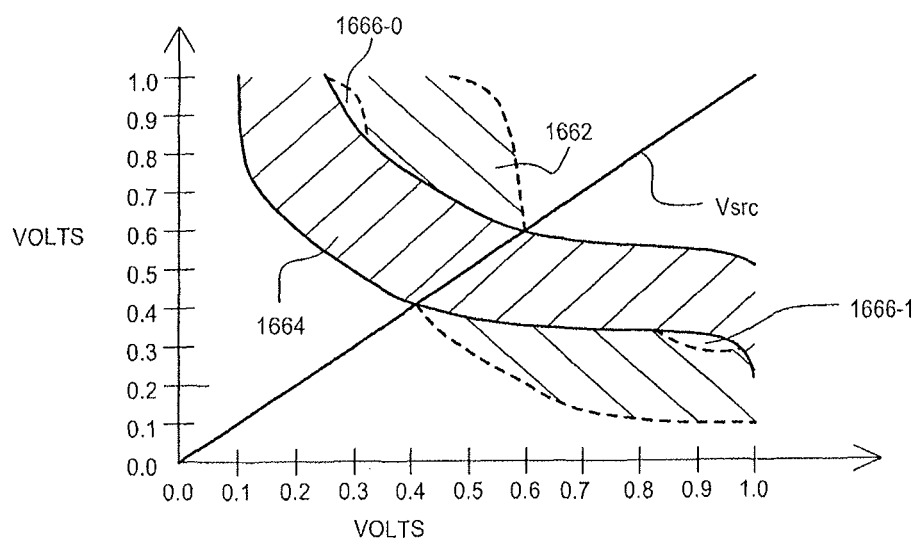

Referring now to FIGS. 16A and 16B, a response of a 6-T SRAM cell is shown. FIG. 16A is a schematic diagram showing a 6-T cell that, unlike the embodiment of FIGS. 15A and 15B, includes transistors with doped channels. Such doped channels are subject to RDF, as noted above, resulting in greater response variation. The conventional 6-T SRAM cell is subject to the same simulation conditions as FIG. 15A, and the transistors may also have gate lengths of 28 nm.

FIG. 16B is a graph showing a response of a conventional 6-T SRAM cell under the same simulation conditions as FIG. 15B. Like FIG. 15B, FIG. 16B shows two response variation ranges 1664 and 1662 to the sweeping of Vsrc. However, due to RDF, resulting threshold voltage variations translate into a wider range of responses, resulting eye regions 1666-0 and 1666-1 substantially smaller than those of FIG. 15B.

As noted in conjunction with FIG. 2A, a DDC transistor may take various forms. A DDC transistor according to one very particular embodiment will now be described with reference to FIG. 17. Such a transistor may be included in any of the embodiments shown above, or equivalents.

Figure 17:
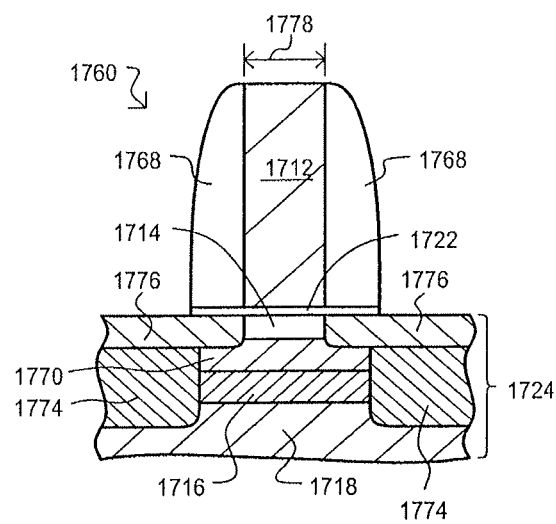
FIG. 17 shows a DOC transistor that may be included in embodiments.

Referring to FIG. 17, a DDC according to a very particular embodiment is shown in a side cross sectional view.

As shown in FIG. 17, a DDC transistor 1760 may include a gate 1712 separated from a substrate 1724 by a gate insulator 1722. A gate 1712 may include insulating sidewalls 1768 formed on its sides. Source and drain regions may include a lightly doped drain (LDD) structures 1776 formed over deep source/drain diffusions 1774 to extend towards each other under a portion of the gate. A DDC stacked channel structure may be formed by a substantially undoped channel layer 1714, a threshold voltage (Vt) set layer 1770 formed by epitaxial growth and implant, or alternatively, by controlled out-diffusion from a screening layer 1716 positioned below the undoped channel layer 1714. The screening layer 1716 acts to define termination of the depletion zone below the gate, while the Vt set layer 1770 adjusts Vt to meet transistor design specifications. In the embodiment shown, screening layer 1716 may be implanted into body/bulk region 1718 so that it extends between and in contact with the source and drain diffusions 1774.

In a very particular embodiment, a DDC transistor 1760 may be an n-channel transistor having a gate length 1778 of 28 nm or less. The screening layer 1716 may have a carrier concentration of greater than about $5 \times 10^{18}$ donors/cm$^3$, while an overlying Vt set layer 1770 may have a carrier concentration of about $5 \times 10^{17}$ to about $5 \times 10^{18}$ donors/cm$^3$. A substantially undoped channel region 1714 may have a carrier concentration of less than about $5 \times 10^{17}$ donors/cm$^3$. It is understood that the above noted carrier concentrations are provided by way of example only and alternate embodiments may include different concentrations according to desired performance in a digital circuit.

Figure 18:
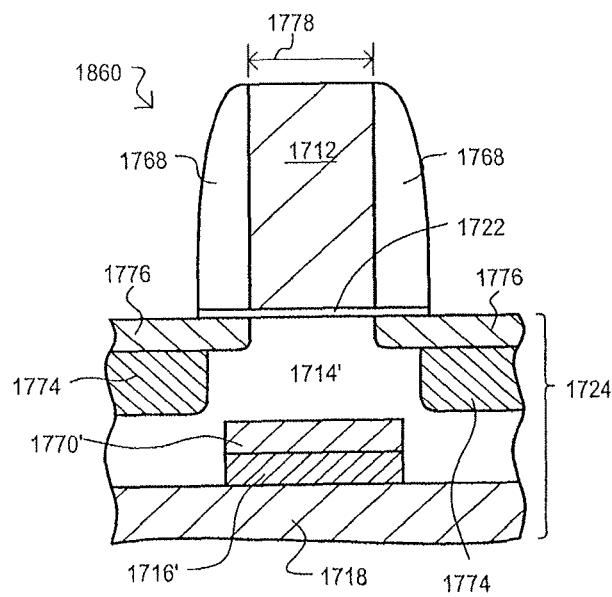
FIG. 18 shows another DOC transistor that may be included in embodiments.

A DDC transistor according to a further embodiment is shown in FIG. 18, and designated by the general reference character 1860. A DDC transistor 1860 may include items like those shown in FIG. 17B, and like items are referred to by the same reference character. DDC transistor 1860 differs from that of FIG. 17B in that screening layer 1716 may be implanted into body/bulk region 1718 so that it extends below the gate without contacting the source and drain diffusions 1774. The above DDC transistors are but particular implementations of a DDC transistor, and should not construed as unduly limiting the circuit elements included within the various digital circuit embodiments shown herein.

Figure 19:
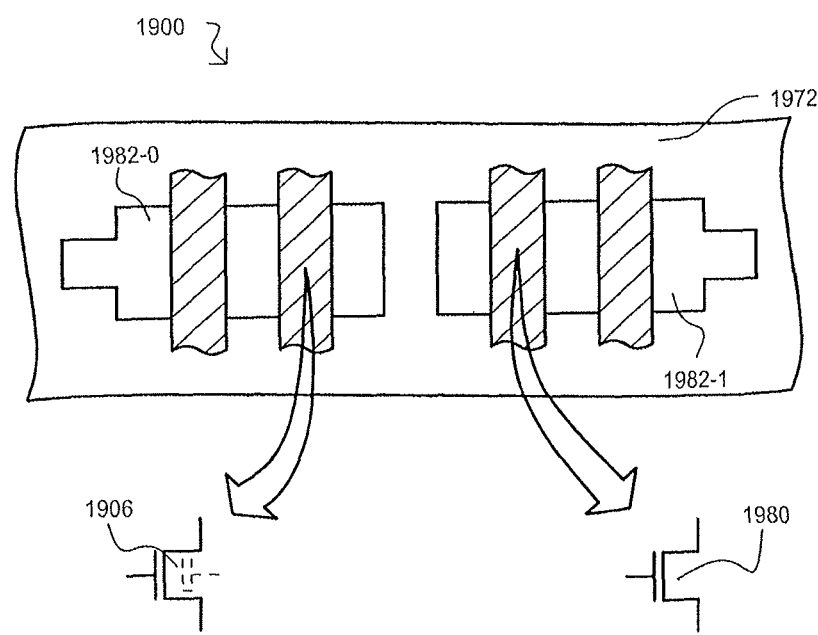
FIG. 19 is a top plan view of an IC device according to an embodiment having both DOC transistors and non-DOC transistors.

As noted above, some embodiments may include DDC transistors and conventional doped channel transistors. FIG. 19 shows a portion of an IC substrate containing such two different types of transistors.

Referring to FIG. 19, an IC device 1900 may include DDC transistor active regions (one shown as 1982-0) and conventional transistor active regions (one shown as 1982-1)

formed in a substrate and separated from one another by isolation structure 1972. A DDC transistor active region 1982-0 may include stacked channel structures formed below a control gate, as described herein, to form one or more DDC transistors (one shown as 1906). A conventional transistor active region 1982-1 may include a doped channel formed below a control gate to form one or more conventional transistors (one shown as 1980). Both types of transistors (e.g., 1982-0 and 1982-1) may form all or part of a digital circuit as described herein, or equivalents.

In this way, an IC device having digital circuits may include both DDC transistors and non-DDC transistors. Alternatively, selective masking to block out areas of a die for manufacture of DDC or non-DDC transistors can be employed, or any other conventional technique for manufacturing die having at least some DDC transistors. This is particularly useful for mixed signal die having multiple transistors types, including high speed digital logic and analog transistors, as well as power efficient logic and/or memory transistors.

Digital circuits according to embodiments shown herein, and equivalents, may provide improved performance over conventional circuits by operating with transistors (e.g., DDC transistors) having lower threshold voltage (Vt) variability. Possible improvements may include faster signal propagation times, as noted above.

Improved performance may translate into reductions in device size. As but one example, digital circuit transistors may be sized with respect to one another to achieve a particular response. Such sizing may take into account expected variations in Vts. Because DDC transistors have lower Vt variation, less sizing margin may be necessary to achieve a desired response. As but one very particular example, SRAM cells may have a predetermined sizing between access transistors and driver transistors. SRAM cells according to the embodiments may lower a relative size scaling between such devices, relative to comparably sized conventional transistors. As SRAM cells may be repeated thousands, or even millions of times in a device, reductions in size by extend beyond expected limits presented by conventional arrays incorporating SRAM cells with doped channels.

In addition, such improvements may include lower operating voltages. In the embodiments, digital circuit switching voltages, established by transistor Vts, may be subject to less variability. Accordingly, a "worst" switching point may be lower, allowing for an operating voltage to be correspondingly lower. In some embodiments, operating voltages (Vsupply) may be no greater than 1 V, and a threshold voltage may be no greater than 0.6*Vsupply.

As noted above, in some embodiments digital circuits may include DDC transistors body bias connections driven with a bias voltage different than a logic high or low voltage. A screening layer within such transistors may enable higher body effect for modulating threshold voltage. In such embodiments, a variation in threshold utilizing a body effect may be achieved with a lower body bias voltage than conventional transistors. Body effect modulation may enable bodies to be driven to reduce threshold voltage, and hence reduce leakage.

Digital circuits according to embodiments may have lower power consumption than circuits employing conventional doped channels. As noted above, because a worst case threshold voltage variation may be low, a power supply voltage may be reduced, which may reduce power consumption. In addition, substantially undoped channels in DDC devices may have improved mobility as compared to some conventional transistors, and hence provide lower channel resistance.

It should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention may be practiced in the absence of an element and/or step not specifically disclosed. That is, an inventive feature of the invention may be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A digital logic circuit configured to receive N input signals, comprising:
   a plurality of transistors having controllable current paths coupled between a first logic node and a second logic node, the transistors configured to selectively couple an output node to the first or second logic node in response to at least one input signal;
   wherein at least one of transistor has a deeply depleted channel formed below its gate that includes a substantially undoped channel region formed over a relatively highly doped screen layer formed over a doped body region;
   wherein N pairs of transistors are of complementary conductivity types, with each transistor of a pair having a gate coupled to receive a same input signal, N being an integer of at least one, at least one pair of transistors forming a passgate comprising:
   at least a first pass transistor of a first conductivity type having a source-drain path coupled between the input signal and the output node and a gate coupled to receive a first enable signal;
   at least a second pass transistor of a second conductivity type having a source-drain path coupled between the input signal and the output node and a gate coupled to receive a second enable.

2. The circuit of claim 1, wherein the circuit includes a flip-flop comprising two stages coupled in series with one another, each stage including an input passgate, and a clocked latch that latches a data value from the corresponding input passgate at a different timing than data is provided from the input passgate.

3. The circuit of claim 1, wherein each of the plurality of transistors is formed using a semiconductor fabrication sequence that includes providing a substrate, forming a blanket epitaxial layer thereon with the blanket epitaxial layer resulting in a layer of intrinsic silicon and establishing a channel for each transistor, forming isolation structures between adjacent transistors after forming the blanket epitaxial layer, with all steps in the fabrication sequence selected to be held within a predefined thermal budget.

4. The circuit of claim 3, wherein each of the plurality of transistors includes a well having a preselected dopant profile, the dopant profile configured so that a predefined portion of the channel remains substantially undoped, the preselected dopant profile having a notched profile in the continuum of dopant concentration.

5. The circuit of claim 4, wherein the circuit is configured to provide and receive signals from a random access memory cell.

6. The circuit of claim 5, wherein said random access memory cell is a static random access memory cell.

* * * * *